US010263321B2

(12) United States Patent
Shirai et al.

(10) Patent No.: US 10,263,321 B2
(45) Date of Patent: Apr. 16, 2019

(54) PLANAR ANTENNA ASSEMBLY

(71) Applicant: YAZAKI CORPORATION, Tokyo (JP)

(72) Inventors: Mizuki Shirai, Susono (JP); Hiroki Kondo, Susono (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 15/690,552

(22) Filed: Aug. 30, 2017

(65) Prior Publication Data

US 2018/0131082 A1    May 10, 2018

(30) Foreign Application Priority Data

Nov. 8, 2016   (JP) .................. 2016-217999

(51) Int. Cl.
| | | |
|---|---|---|
| H01Q 1/00 | (2006.01) |
| H01Q 1/32 | (2006.01) |
| H01Q 1/50 | (2006.01) |
| H01Q 9/04 | (2006.01) |
| H05K 1/16 | (2006.01) |
| H01Q 1/12 | (2006.01) |
| H05K 1/02 | (2006.01) |
| H05K 1/18 | (2006.01) |
| H05K 1/03 | (2006.01) |
| H05K 1/14 | (2006.01) |
| H05K 3/36 | (2006.01) |

(52) U.S. Cl.
CPC ............ H01Q 1/32 (2013.01); H01Q 1/3275 (2013.01); H01Q 1/50 (2013.01); H01Q 9/0407 (2013.01); H05K 1/165 (2013.01); *H01Q 1/12* (2013.01); *H05K 1/028* (2013.01); *H05K 1/0393* (2013.01); *H05K 1/147* (2013.01); *H05K 1/181* (2013.01); *H05K 3/361* (2013.01); *H05K 2201/10098* (2013.01)

(58) Field of Classification Search
CPC .......... H01Q 1/32; H01Q 1/50; H01Q 9/0407; H01Q 1/12; H05K 2201/10098; H05K 1/181; H05K 1/028
USPC ........................................ 343/906, 713, 905
See application file for complete search history.

(56) References Cited

U.S. PATENT DOCUMENTS

| | | | | |
|---|---|---|---|---|
| 2010/0231468 A1* | 9/2010 | Ogino | ................. | H01Q 1/1271 343/713 |
| 2013/0249748 A1* | 9/2013 | Togura | .................... | H01Q 1/22 343/713 |
| 2015/0311586 A1* | 10/2015 | Andrews | ................ | H01B 13/06 343/906 |
| 2015/0380916 A1* | 12/2015 | Shimada | ............. | B60R 16/0207 174/72 A |

FOREIGN PATENT DOCUMENTS

JP    2004-289578 A    10/2004
JP    2015-80072 A     4/2015

* cited by examiner

*Primary Examiner* — Jean B Jeanglaude
(74) *Attorney, Agent, or Firm* — Sughrue Mion, PLLC

(57) ABSTRACT

A planar antenna assembly includes an antenna and a long transmission line. The antenna is configured to receive a radio wave signal from the outside. The radio wave signal received by the antenna is transmitted through the transmission line. The antenna and the transmission line are formed in a planar shape. The transmission line includes a conductor having a thickness thicker than a thickness of the antenna.

2 Claims, 6 Drawing Sheets

PLANAR ANTENNA ASSEMBLY

CROSS REFERENCE TO RELATED APPLICATIONS

This application is based on Japanese Patent Application (No. 2016-217999) filed on Nov. 8, 2016, the contents of which are incorporated herein by way of reference.

BACKGROUND

The present invention relates to a planar antenna assembly.

In the related art, a planar antenna assembly including a planar antenna has been proposed (for example, refer to Patent Document 1). In such a planar antenna assembly, a planar antenna that receives a radio wave signal from the outside, and a transmission line that outputs the radio wave signal received by the planar antenna are integrally formed on a flexible printed circuit board.

In recent years, there is a tendency to configure a vehicle body with a resin. For this reason, instead of a metal vehicle body which may hinder reception of a radio wave signal, a fiber-reinforced plastic or the like which does not hinder reception of a radio wave signal, is used for the vehicle body, and for example, a planar antenna represented by the planar antenna assembly described in Patent Document 1 may be provided in a narrow gap of a roof portion inside the vehicle body.

[Patent Document 1] JP-A-2004-289578

SUMMARY

One object of the present invention is to provide a planar antenna assembly that can solve a difficulty of securing a space and suppress attenuation of a signal.

According to one advantageous aspect of the present invention, there is provided a planar antenna assembly including:

an antenna configured to receive a radio wave signal from the outside; and a long transmission line through which the radio wave signal received by the antenna is transmitted, wherein the antenna and the transmission line are formed in a planar shape, and wherein the transmission line includes a conductor having a thickness thicker than a thickness of the antenna.

A portion of the antenna and a portion of the transmission line may be stacked and connected to each other, and resin layers may be provided at least on a top and a bottom of a stacked portion where the antenna and the transmission line are stacked.

DETAILED DESCRIPTION OF EXEMPLIFIED EMBODIMENTS

Here, in a case where a planar antenna as described in Patent Document 1 is provided in the gap of the roof portion, a configuration in which a planar antenna and a coaxial cable for guiding a signal from the planar antenna to an instrument panel are included is considered. In this case, the planar antenna and the coaxial cable are connected to each other by a connector.

However, since the planar antenna is provided in the narrow gap of the roof portion, when providing the connector and performing connection using the connector, it is difficult to secure a space. Thus, a method that uses the planar antenna assembly in which an antenna and a transmission line are integrated on a flexible printed circuit board and which is described in Patent Document 1, is considered.

However, in a case where a transmission line is integrated with a printed circuit as in the planar antenna assembly described in Patent Document 1, when performing transmission between the roof and the instrument panel (approximately 1.5 m), due to the printed circuit having low conductivity, there is a problem that attenuation of a signal increases. As a result, there is a possibility that a device of the instrument panel cannot receive the radio wave signal from the antenna.

The present invention has been made to solve the above-mentioned problems in the related art, and an object thereof is to provide a planar antenna assembly that can solve a difficulty of securing a space and suppress attenuation of a signal.

Hereinafter, a preferred embodiment of the present invention will be described with reference to the accompanying drawings. The present invention is not limited to the embodiment described below, and can be appropriately modified without departing from the spirit of the present invention. In addition, in the embodiment described below, although an illustration and an explanation of a partial configuration are omitted, it goes without saying that a publicly-known technology or a well-known technology may be appropriately applied to omitted details of the technology as long as there is no inconsistency in contents described below.

Figure 1:
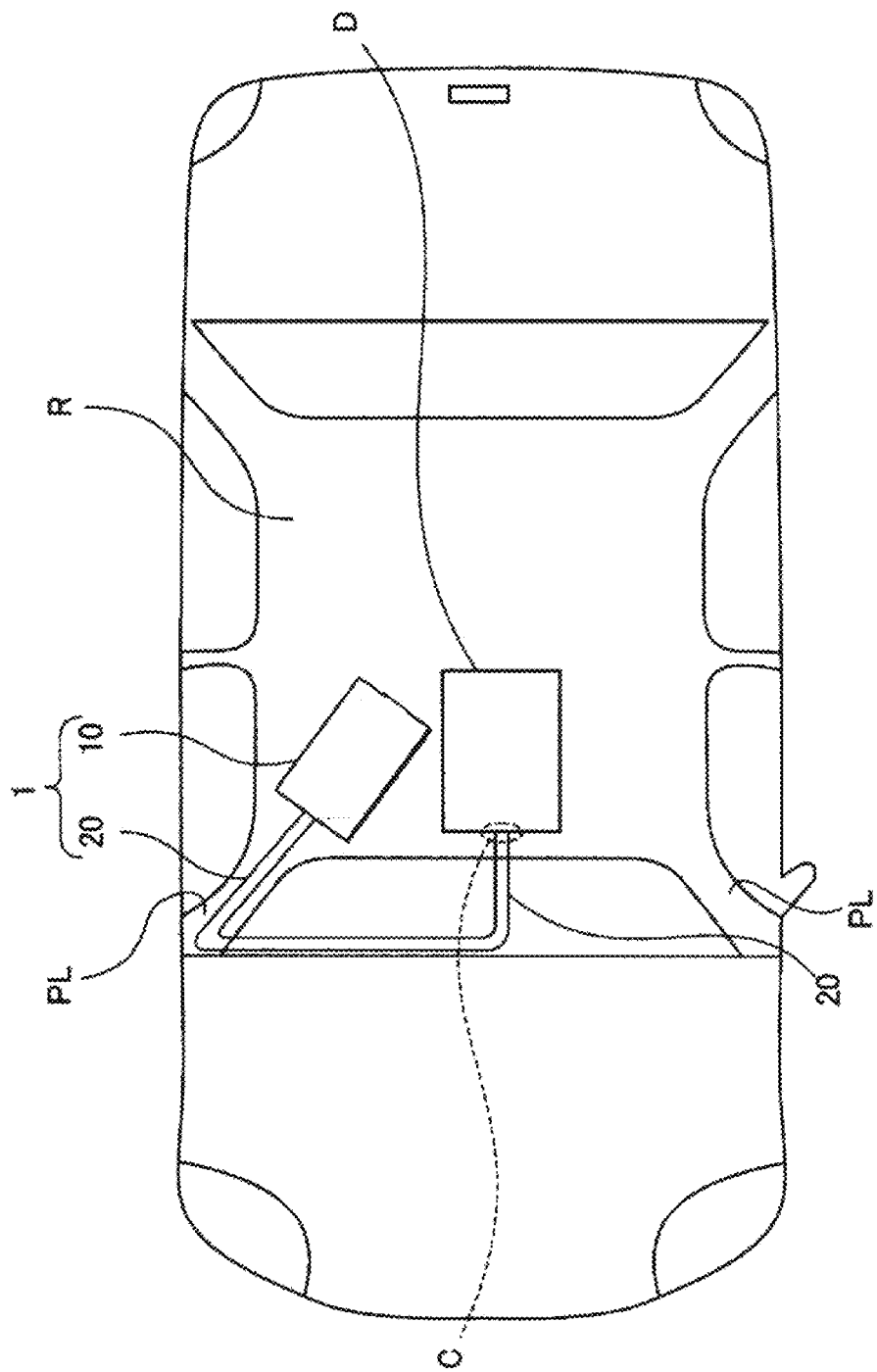
FIG. 1 is a top view of a vehicle in which a planar antenna assembly according to an embodiment of the present invention is disposed.
Figure 2:
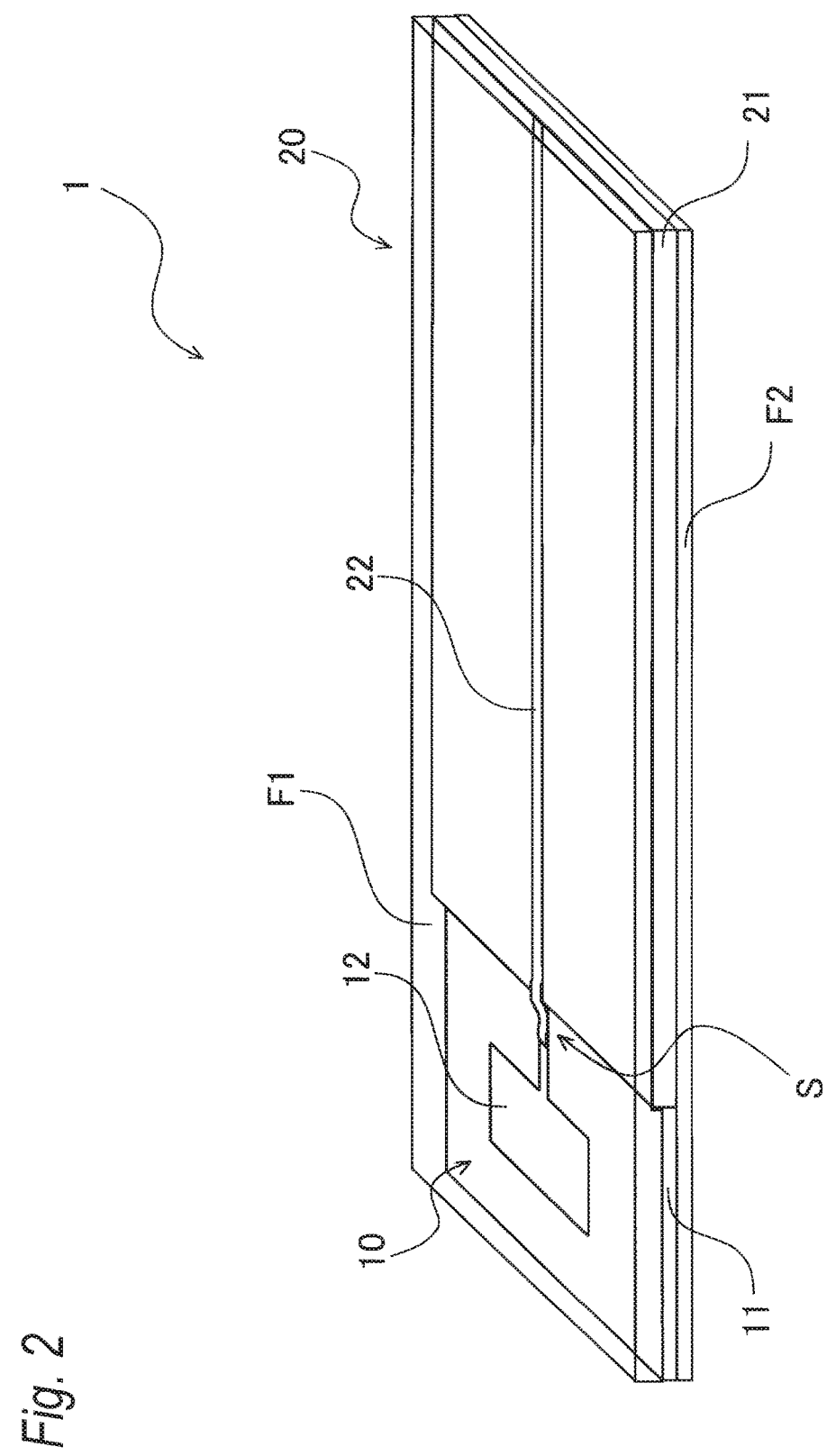
FIG. 2 is a perspective view illustrating the planar antenna assembly illustrated in FIG. 1.

FIG. 1 is a top view of a vehicle in which a planar antenna assembly according to an embodiment of the present invention is disposed, and FIG. 2 is a perspective view illustrating the planar antenna assembly illustrated in FIG. 1.

As illustrated in FIGS. 1 and 2, the planar antenna assembly 1 is configured with an antenna unit 10 that receives a radio wave signal from the outside, and a long transmission unit 20 that transmits the radio wave signal received by the antenna unit 10. The antenna unit 10 is provided on a roof R of the vehicle. The transmission unit 20 is provided in a pillar PL of the vehicle, and an end portion of the transmission unit 20 (at the opposite side of the antenna unit 10) is connected to an in-vehicle device D via, for example, a connector C. Thus, the planar antenna assembly 1 is configured to receive a radio wave signal by using the antenna unit 10 and transmit the received radio wave signal to the in-vehicle device D by using the transmission unit 20.

The roof R is configured with a resin constituting a vehicle body (for example, a fiber-reinforced resin) and a decorative plate which is adhered to the resin extending from a vehicle interior, and the antenna unit 10 is provided in a gap between the resin and the decorative plate.

More specifically, as illustrated in FIG. 2, the planar antenna assembly 1 is formed as a rectangular sheet having a predetermined width and a predetermined length. One end of the rectangular sheet is configured with the antenna unit 10, and a portion excluding the one end is configured with the transmission unit 20.

The antenna unit 10 is configured with a general-purpose board 11 (for example, PET film) having a predetermined thickness (for example, 250 μm) and a printed circuit 12 printed on the general-purpose board 11, and the printed circuit 12 functions as an antenna. In addition, a thickness of the printed circuit 12 is approximately 10 μm.

The transmission unit 20 is configured with a general-purpose board 21 (for example, PET film) having a predetermined thickness (for example, 500 μm) and a flat conductor 22 mounted on the general-purpose board 21, and the flat conductor 22 functions as a transmission line. In addition, a thickness of the flat conductor 22 is approximately 35 μm. Further, the flat conductor 22 is bonded to the general-purpose board 21 by hot-melt bonding, thermocompression bonding, ultrasonic bonding, laser welding, or the like.

As described above, in the present embodiment, the transmission line (flat conductor 22) is thicker than the antenna (printed circuit 12). A thickness of the flat conductor 22 is preferably twice or more and five times or less the thickness of the printed circuit 12. When the thickness of the flat conductor 22 is less than twice the thickness of the printed circuit 12, the thickness of the flat conductor 22 becomes thin, and thus the flat conductor 22 is likely to be influenced by a manufacturing variation. When the thickness of the flat conductor 22 is greater than five times the thickness of the printed circuit 12, a difference in level between the flat conductor 22 and the printed circuit 12 increases, and thus it is difficult to integrate the flat conductor 22 and the printed circuit 12. Further, the thickness of the flat conductor 22 is more preferably three times or more and four times or less than that of the printed circuit 12. When the thickness of the flat conductor 22 is within the range, a better result can be obtained in consideration of an influence due to the manufacturing variation and an integration problem.

A portion of the flat conductor 22 is stacked on a portion of the printed circuit 12 via an electrically-conductive adhesive, and is electrically connected to the portion of the printed circuit 12. In addition, resin layers F1 and F2 (for example, laminate films or resins coated by a dispenser) are provided on the top and the bottom of the stacked portion S. The resin layers F1 and F2 are provided so as to interpose not only the stacked portion S but also the transmission unit 20. In addition, the resin layers F1 and F2 may be provided so as to interpose the antenna unit 10, or may not be provided.

Figure 3:
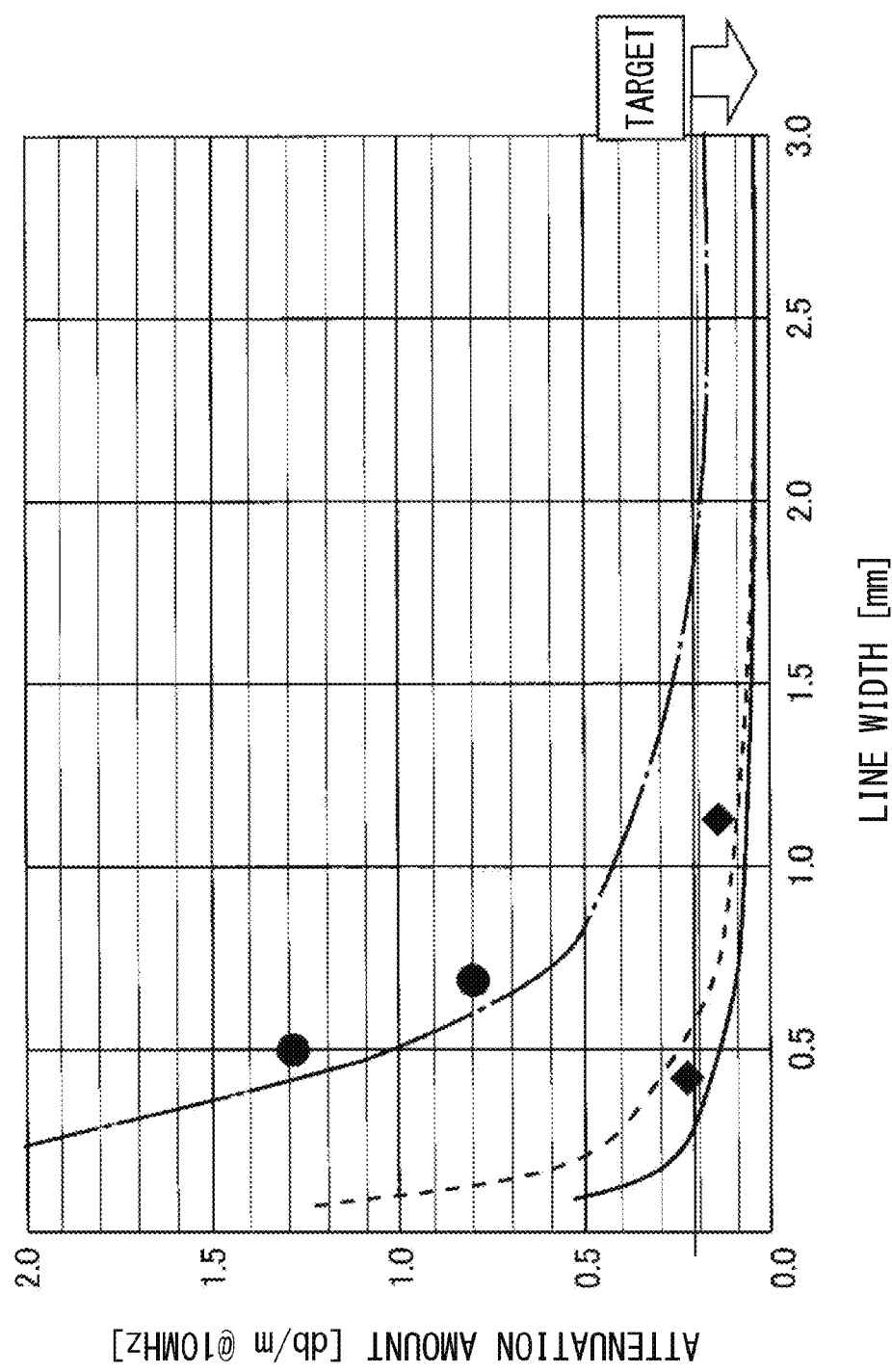
FIG. 3 is a graph illustrating a correlation between a line width of a transmission line and an attenuation amount of a transmission line.

FIG. 3 is a graph illustrating a correlation between a line width of the transmission line and an attenuation amount of the transmission line. In FIG. 3, a solid line indicates a theoretical characteristic of a transmission line (with a specific resistance of $1.68 \times 10^{-6}$ Ω·cm) configured with the flat conductor 22 according to the present embodiment, a one-dot chain line indicates a theoretical characteristic of a transmission line (with a specific resistance of $2 \times 10^{-5}$ Ω·cm) configured with a printed circuit on which an ink containing a silver filler having a particle size of micro order is printed, and a broken line indicates a theoretical characteristic of a transmission line (with a specific resistance of $5 \times 10^{-6}$ Ω·cm) configured with a printed circuit on which an ink containing a silver filler having a particle size of nano order is printed. In addition, in FIG. 3, a square mark indicates an actually-measured characteristic of a transmission line configured with the flat conductor 22 according to the present embodiment, and a round mark indicates an actually-measured characteristic of a transmission line configured with a printed circuit on which an ink containing a silver filler having a particle size of micro order is printed.

First, in order to transmit a radio wave signal from the roof R to the in-vehicle device D of an instrument panel, the transmission line needs to have a length of, for example, 1.5 m. Thus, as illustrated in FIG. 3, in order to transmit a radio wave signal to the in-vehicle device D, for a high-frequency signal of 10 MHz, a target value of the attenuation amount of the transmission line is set to, for example, 0.21 dB/m or less.

The flat conductor 22 according to the present embodiment satisfies the target value in the theoretical characteristic when the line width thereof is 0.3 mm or more, and also satisfies the target value in the actually-measured characteristic when the line width thereof is 0.5 mm or more. On the other hand, in a printed circuit with a specific resistance of $5 \times 10^{-6}$ Ω·cm, it is estimated that the printed circuit satisfies the target value in the theoretical characteristic when the line width of the printed circuit is approximately 0.6 mm or more, and that the printed circuit satisfies the target value in the actually-measured characteristic when the line width of the printed circuit further increases. In addition, a printed circuit with a specific resistance of $2 \times 10^{-5}$ Ω·cm does not satisfy the target value in the theoretical characteristic unless the line width thereof is approximately 1.9 mm or more. In addition, since an attenuation amount in the actually-measured characteristic is greater than an attenuation amount in the theoretical characteristic, it is estimated that the line width of the printed circuit becomes wide.

Figure 4:
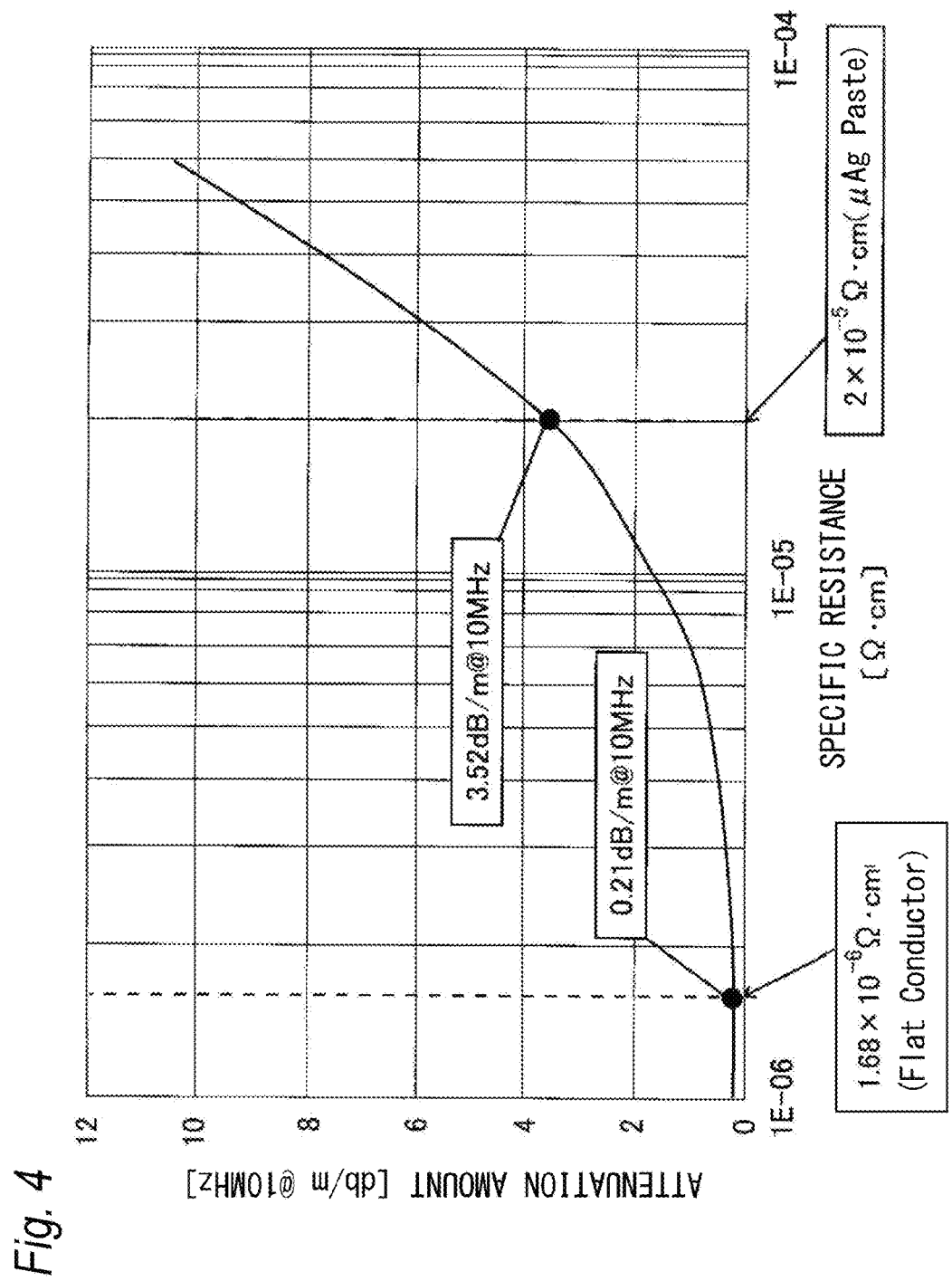
FIG. 4 is a graph illustrating a correlation between a specific resistance and an attenuation amount.

FIG. 4 is a graph illustrating a correlation between a specific resistance and an attenuation amount. FIG. 4 illustrates a correlation between a specific resistance and an attenuation amount (attenuation amount for a high-frequency signal of 10 MHz) when the line width is 0.3 mm.

As illustrated in FIG. 4, in a case of a printed circuit with a specific resistance of $2 \times 10^{-6}$ Ω·cm, an attenuation amount becomes 3.52 dB/m when the line width is 0.3 mm. On the other hand, in a case of the flat conductor 22 with a specific resistance of $1.68 \times 10^{-6}$ Ω·cm according to the present embodiment, when the line width is 0.3 mm, 0.21 dB/m as the target value can be achieved.

As described above, the thickness of the flat conductor 22 according to the present embodiment is thicker than that of the printed circuit 12 of the antenna unit 10. For example, in a case where the specific resistance is $1.68 \times 10^{-6}$ Ω·cm, when the line width is 0.3 mm or more, the attenuation amount for the high-frequency signal of 10 MHz can be set to 0.21 dB/m.

In the above description, although the target value of the attenuation amount for the high-frequency signal of 10 MHz is 0.21 dB/m, the target value is not limited to the value. For example, in a case where an amplifier circuit is formed between the antenna unit 10 and the transmission unit 20, the target value of the attenuation amount may be a higher value, or an attenuation amount for a high-frequency signal of another frequency may be set to the target value.

Figure 5:
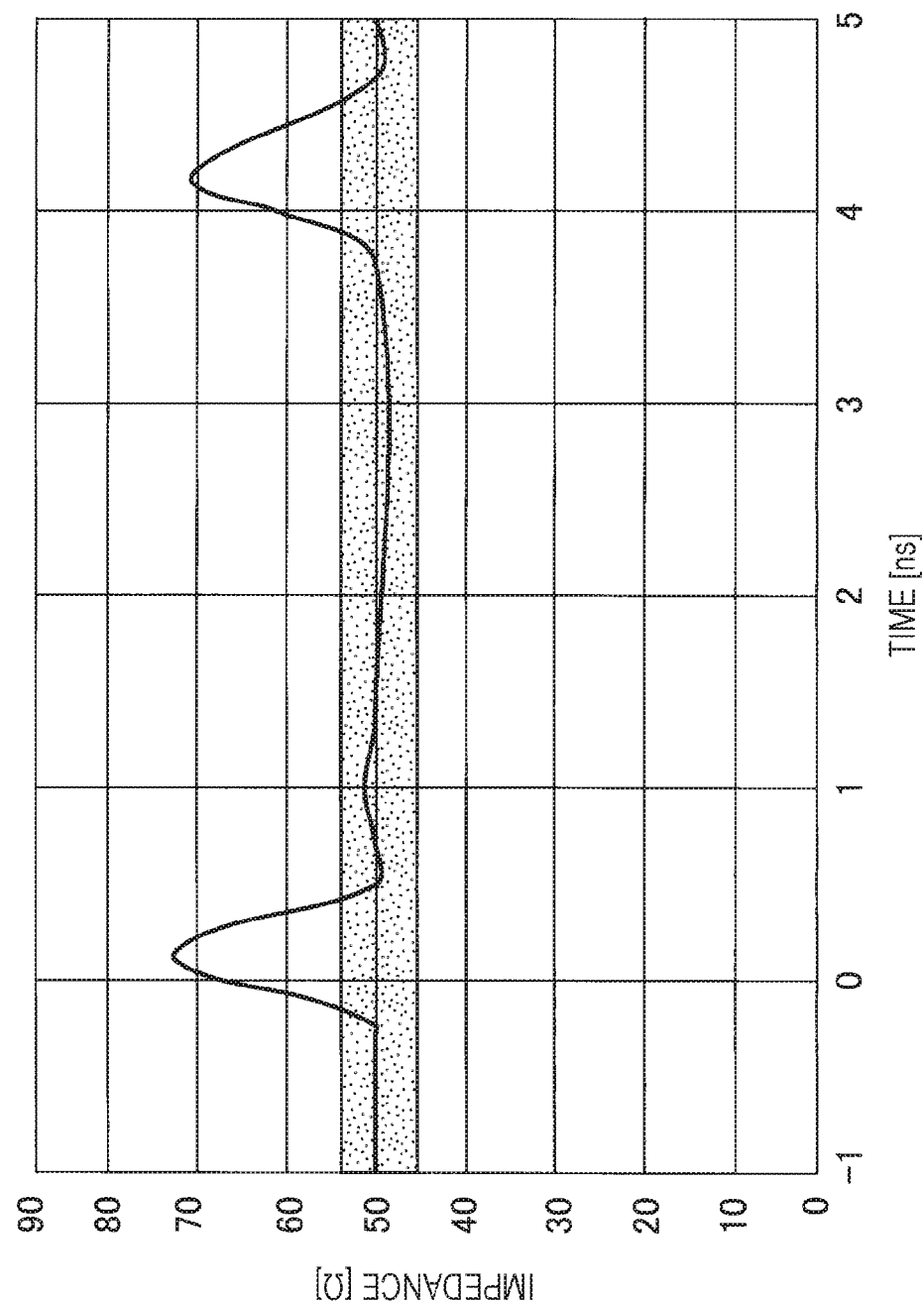
FIG. 5 is a graph illustrating impedance of a transmission unit illustrated in FIG. 1.

FIG. 5 is a graph illustrating impedance of the transmission unit 20 illustrated in FIG. 1. FIG. 5 illustrates an example in which the line width of the flat conductor 22 is 0.3 mm and the thickness of the flat conductor 22 is 35 μm.

As illustrated in FIG. 5, in the present embodiment, the impedance can be adjusted by adjusting thicknesses of the resin layers F1 and F2. Thus, in a case where a target range of the impedance is a range of 50 Ω±4Ω (in a case where target impedance is impedance similar to that of the coaxial cable), for example, when the thicknesses of the resin layers F1 and F2 are 0.8 mm and the total thickness is 1.6 mm, the target range can be satisfied.

Figure 6A:
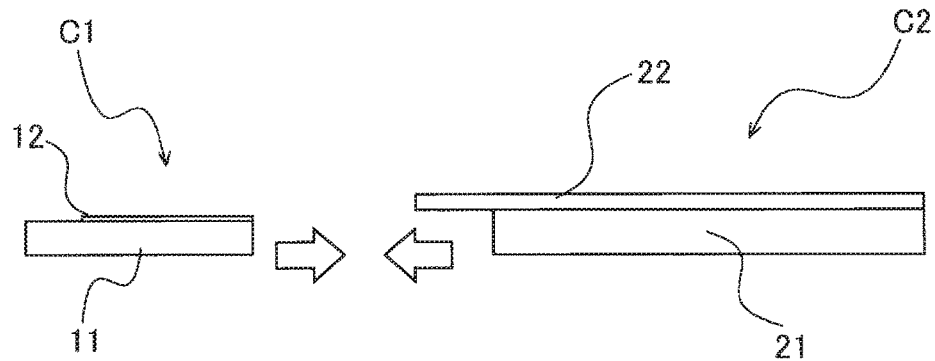
FIGS. 6A to 6C are side views illustrating a manufacturing method of the planar antenna assembly according to the present embodiment.
Figure 6B:
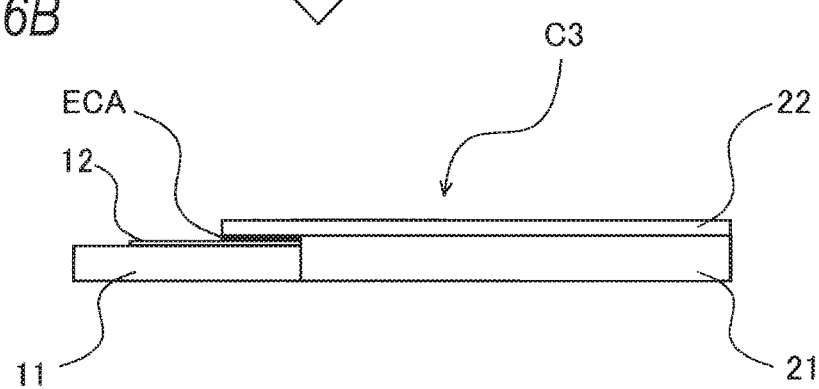
Figure 6C:
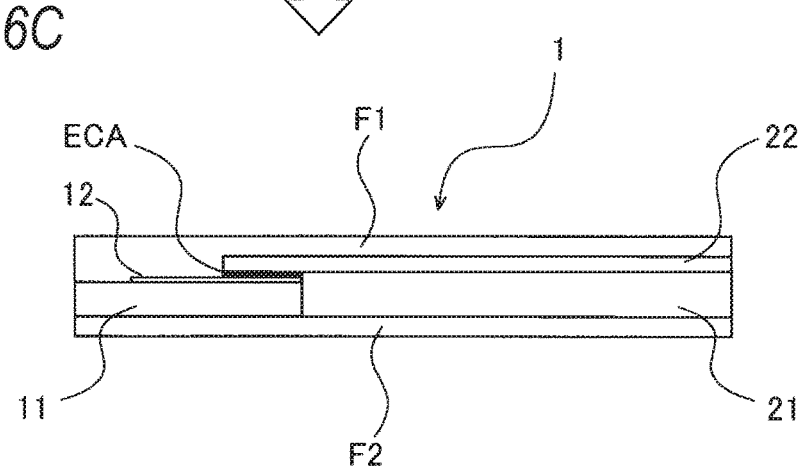

Next, a manufacturing method of the planar antenna assembly 1 according to the present embodiment will be described. FIGS. 6A to 6C are side views illustrating a manufacturing method of the planar antenna assembly 1 according to the present embodiment.

As illustrated in FIG. 6A, when manufacturing the planar antenna assembly 1, first, the printed circuit 12 is formed by performing printing on the general-purpose board 11 having a predetermined thickness. Thereby, a first intermediate body C1 is formed. Further, the flat conductor 22 is bonded onto the general-purpose board 21 having a predetermined thickness. Thereby, a second intermediate body C2 is formed. The flat conductor 22 is bonded by hot-melt bonding, thermocompression bonding, ultrasonic bonding, laser welding, or the like. In addition, in the second intermediate body C2, the flat conductor 22 is bonded onto the general-purpose board 21 in a state where a portion of the flat conductor 22 protrudes laterally from the upper side of the general-purpose board 21.

Next, as illustrated in FIG. 6B, a third intermediate body C3 is formed by stacking the portion (protruded portion) of the flat conductor 22 on a portion of the printed circuit 12 of the first intermediate body C1. An electrically-conductive adhesive ECA is interposed between the portion of the printed circuit 12 and the portion of the flat conductor 22 that are stacked with each other. On the other hand, the electrically-conductive adhesive ECA may not be interposed as necessary.

Next, as illustrated in FIG. 6C, the resin layers F1 and F2 having the thicknesses which are set based on the relationship of the target impedance, are provided on the top and the bottom of the third intermediate body C3. Thereby, the planar antenna assembly 1 is manufactured.

As described above, in the planar antenna assembly 1 according to the present embodiment, not only the printed circuit 12 as an antenna but also the flat conductor 22 as a transmission line is formed in a planar shape. Thus, the planar antenna assembly 1 can be advantageous in terms of space as compared with a case where a planar antenna and a coaxial cable are connected to each other. In addition, since the thickness of the flat conductor 22 is thicker than that of the printed circuit 12, it is possible to suppress attenuation of a signal by decreasing the specific resistance of the transmission line. Therefore, it is possible to solve a difficulty of securing a space, and suppress attenuation of a signal.

In addition, since the portion of the printed circuit 12 and the portion of the flat conductor 22 are stacked and connected to each other, the electrical connection between the printed circuit 12 and the flat conductor 22 can be made by contacting surfaces of the printed circuit 12 and the flat conductor 22 with each other. Further, since the resin layers F1 and F2 are provided so as to interpose the stacked portion, the electrical connection between the printed circuit 12 and the flat conductor 22 can be reliably made by fixing the stacked portion.

Although the present invention has been described based on the embodiment, the present invention is not limited to the embodiment. The embodiment may be modified without departing from the spirit of the present invention, or may be appropriately combined with a publicly-known technology or a well-known technology within a possible range.

For example, in the embodiment, although the transmission unit 20 is disposed in the A pillar PL, the disposition of the transmission unit 20 is not limited thereto. The transmission unit 20 may be disposed in a B pillar or a C pillar.

In addition, although the portion of the printed circuit 12 and the portion of the flat conductor 22 are connected to each other by surface contact, the connection between the printed circuit 12 and the flat conductor 22 is not limited thereto. End portions of the printed circuit 12 and the flat conductor 22 may be brought into contact with each other, or the printed circuit 12 and the flat conductor 22 may be electrically connected to each other via another member other than the electrically-conductive adhesive ECA.

Here, features of the embodiments of the planar antenna assembly according to the present invention described above are collectively listed in respective (i) to (ii) in brief.

(i) A planar antenna assembly (1) comprising:
an antenna (10) configured to receive a radio wave signal from the outside; and
a long transmission line (20) through which the radio wave signal received by the antenna (10) is transmitted,
wherein the antenna (10) and the transmission line (20) are formed in a planar shape, and
wherein the transmission line (20) includes a conductor (22) having a thickness thicker than a thickness of the antenna (10).

(ii) The planar antenna assembly (1) according to the above (i), wherein
a portion of the antenna (10) and a portion of the transmission line (20) are stacked and connected to each other, and
resin layers (F1, F2) are provided at least on a top and a bottom of a stacked portion (S) where the antenna (10) and the transmission line (20) are stacked.

According to the planar antenna assembly, not only the antenna but also the transmission line is formed in a planar shape, and thus it can be advantageous in terms of space as compared with a case where a planar antenna and a coaxial cable are connected to each other. In addition, the transmission line is configured with a conductor having a thickness thicker than that of the antenna, and thus it is possible to suppress attenuation of a signal by decreasing a specific resistance of the transmission line. Therefore, it is possible to solve a difficulty of securing a space, and suppress attenuation of a signal.

According to the planar antenna assembly, a portion of the antenna and a portion of the transmission line are stacked and connected to each other, and thus an electrical connection between the planar antenna and the planar transmission line can be made by contacting surfaces of the antenna and the transmission line with each other. Further, resin layers are provided so as to interpose the stacked portion, and thus the electrical connection between the antenna and the transmission line can be reliably made by fixing the stacked portion.

According to the present invention, it is possible to provide a planar antenna assembly that can solve a difficulty of securing a space and suppress attenuation of a signal.

What is claimed is:
1. A planar antenna assembly comprising:
an antenna configured to receive a radio wave signal from the outside; and
a long transmission line through which the radio wave signal received by the antenna is transmitted, wherein the antenna and the transmission line are formed in planar shapes, respectively, and wherein the transmission line includes a conductor having a thickness thicker than a thickness of the antenna.

2. The planar antenna assembly according to claim 1, wherein a portion of the antenna and a portion of the transmission line are stacked and connected to each other, and resin layers are provided at least on a top and a bottom of a stacked portion where the antenna and the transmission line are stacked.

* * * * *